(12) United States Patent
Lehner et al.

(10) Patent No.: US 12,013,266 B2
(45) Date of Patent: Jun. 18, 2024

(54) FLOWMETER COMPRISING AN ELECTRONIC MAGNETIC SENSOR WITH BUFFERED POWER SUPPLY

(71) Applicant: Bleckmann GmbH & Co. KG, Lamprechtshausen (AT)

(72) Inventors: Ernst Lehner, Grödig (AT); Andreas Pleschinger, Schleedorf (AT)

(73) Assignee: Bleckmann GmbH & Co. KG, Lamprechtshausen (AT)

( * ) Notice: Subject to any disclaimer, the term of this patent is extended or adjusted under 35 U.S.C. 154(b) by 661 days.

(21) Appl. No.: 17/116,075

(22) Filed: Dec. 9, 2020

(65) Prior Publication Data

US 2021/0172772 A1 Jun. 10, 2021

(30) Foreign Application Priority Data

Dec. 10, 2019 (EP) ..................................... 19214926

(51) Int. Cl.
*G01F 1/075* (2006.01)
*D06F 33/43* (2020.01)
(Continued)

(52) U.S. Cl.
CPC .............. *G01F 1/075* (2013.01); *D06F 33/43* (2020.02); *G01F 1/103* (2013.01); *G01F 1/115* (2013.01); *G01F 1/125* (2013.01); *G01F 1/74* (2013.01)

(58) Field of Classification Search
CPC .......... G01F 1/125; G01F 1/115; G01F 1/103; G01F 1/075
(Continued)

(56) References Cited

U.S. PATENT DOCUMENTS 4,101,874 A 7/1978 Denison et al.
4,885,943 A 12/1989 Tootell et al.
(Continued)

FOREIGN PATENT DOCUMENTS

CN 201233438 Y 5/2009
CN 201740550 U 2/2011
(Continued)

OTHER PUBLICATIONS

EPO; Application No. 19214926.8; Extended European Search Report dated Jun. 9, 2020.
(Continued)

*Primary Examiner* — Christopher E Mahoney
(74) *Attorney, Agent, or Firm* — Fitch, Even, Tabin & Flannery LLP

(57) ABSTRACT

A flow meter for a home appliance, in particular a dishwasher or a washing machine, the flow meter comprising a control unit having a first power supply terminal, a second power supply terminal and a digital input terminal which is connected to the second power supply terminal via a limiting element; a movable element which is moved by a flow of a fluid and which comprises at least one movable magnetic element; and a two-lead magneto-sensitive unit which comprises a signal terminal connected to the digital input terminal of the control unit and a reference terminal connected to the first power supply terminal of the control unit; wherein the magneto-sensitive unit comprises a magnetic sensor element having two output terminals connected to the signal terminal and the reference terminal, and a power supply terminal; and a buffered power supply unit configured to generate a continuous auxiliary voltage from the signal terminal and the reference terminal of the magneto-sensitive unit and to provide the continuous auxiliary voltage at the power supply terminal of the magnetic sensor element.

22 Claims, 3 Drawing Sheets

(51) Int. Cl.
*G01F 1/10* (2006.01)
*G01F 1/115* (2006.01)
*G01F 1/12* (2006.01)
*G01F 1/74* (2006.01)

(58) Field of Classification Search
USPC .......................................................... 324/667
See application file for complete search history.

(56) References Cited

U.S. PATENT DOCUMENTS

| | | | | |
|---|---|---|---|---|
| 6,653,968 | B1 * | 11/2003 | Schneider | G01P 3/489 |
| | | | | 375/243 |
| 7,071,686 | B1 * | 7/2006 | Burns | B60C 23/02 |
| | | | | 264/1.31 |
| 2003/0173958 | A1 * | 9/2003 | Goldfine | G01N 27/904 |
| | | | | 73/779 |
| 2009/0298649 | A1 * | 12/2009 | Dyer | A63B 24/0003 |
| | | | | 482/4 |

FOREIGN PATENT DOCUMENTS

| | | | | |
|---|---|---|---|---|
| CN | 102680918 | A | | 9/2012 |
| CN | 103308075 | A | | 9/2013 |
| CN | 204944565 | U | | 1/2016 |
| CN | 106248112 | A | | 12/2016 |
| CN | 206269866 | U | | 6/2017 |
| CN | 207066516 | U | | 3/2018 |
| CN | 109143122 | A | | 1/2019 |
| EP | 3419173 | B1 | | 4/2021 |
| FR | 3004870 | A1 * | 10/2014 | .......... H02M 3/1584 |
| GB | 1492632 | A | | 11/1977 |
| GB | 2472277 | A * | 2/2011 | ............. B25D 17/24 |
| KR | 100676212 | B1 | | 1/2007 |
| WO | WO-2018069123 | A1 * | 4/2018 | .......... H02H 11/003 |

OTHER PUBLICATIONS

CNIPA; Application No. 202011448380.7; Office Action dated Jan. 6, 2022.

* cited by examiner

FLOWMETER COMPRISING AN ELECTRONIC MAGNETIC SENSOR WITH BUFFERED POWER SUPPLY

CROSS-REFERENCE TO RELATED APPLICATION

This application claims the benefit of European Patent Application No. 19214926.8, filed on Dec. 10, 2019, the entire disclosure of which is incorporated by reference herein.

FIELD OF THE INVENTION

The present invention relates to the field of flow meters, and in particular to home appliances such as dishwashers or washing machines having flow meters for determining and controlling the flow of a fluid. More particularly, the invention relates to home appliances comprising a flow meter with a magneto-sensitive sensor which provides digital pulse signals indicating a flow of a fluid.

BACKGROUND ART

Flow meters which generate digital pulse signals according to the flow of a fluid are well-known and widely used in home appliances such as dishwashers and washing machines. Such flow meters usually comprise a movable element such as an impeller or vane wheel which is rotated by the flow of a fluid to be measured, so that the rotating speed of the impeller is substantially proportional to the rate of flow. Commonly, the impeller or vane wheel comprises a magnetic element such as a permanent magnet rotating with the wheel, wherein a magnetically sensitive reed contact is arranged adjacent to the rotating impeller (usually attached to the outside of an impeller casing) and opens and closes its contact depending on the rotational position of the impeller due to the varying magnetic flux or field applied by the rotating magnetic element to the reed contact. Commonly, one terminal of the reed contact is connected to ground, and the other terminal is connected to a digital input terminal of an evaluating circuit or control unit, wherein this digital input terminal is further connected to a supply voltage via a so called pull-up resistor, in order to provide a well-defined digital HIGH signal (according to TTL logic levels, for example) when the reed contact is open and a LOW signal when the reed contact is closed. The evaluation circuit or control unit detects the consecutive HIGH and LOW level signals at the digital input terminal and determines the rate of flow (i.e. volume and/or volumetric flow rate) depending on the pulse rate (e.g. the rate of HIGH-LOW transitions) generated at the digital input terminal.

With reference to FIG. 5, a flow meter arrangement in a home appliance according to the prior art comprises a control unit or evaluation circuit 10 having a first power supply terminal 16 (providing a first power supply voltage or potential Vs1), a digital input terminal 14 which is connected to a second power supply terminal 18 (providing a second power supply voltage or potential Vs2) via a resistor 12 (so called pull-up resistor). A reed contact 50 is connected between input terminal 14 and first power supply terminal 16. Usually, the first power supply voltage or potential Vs1 corresponds to ground, while the second power supply voltage or potential Vs2 corresponds to a positive supply voltage such as +3.3 V or +5 V usually used in digital circuits such as TTL or CMOS logic. The digital input terminal 14 is thus configured to receive a digital voltage signal (Vd). In other words, digital input terminal 14 detects a HIGH level signal (e.g. close to +3.3 V) when reed contact 50 is in an open state, and a LOW level signal (e.g. 0.0 V or ground) when reed contact 50 is in a closed state. A movable permanent magnet attached an impeller (both not shown in the drawings but well-known to the skilled person) is arranged such that it applies a varying or alternating magnetic field or flux to reed contact 50 when the impeller or vane wheel of the flow meter is rotated by the flow of a fluid to be measured. Thus, the reed contact is repeatedly exposed to a magnetic field of flux and opens and closes intermittently, so that a pulse sequence of HIGH level signals and LOW level signals is generated at digital input terminal 14, the frequency of which is an indication of the flow rate of the fluid and the number of pulses is an indication of the volume (amount) of the conveyed fluid.

While this common digital flow meter arrangement is simple and cost efficient, in particular reed contact 50 entails problems. For example, reed contacts are mechanical switches which generate so called chatter or contact bounce when closing, so that in particular the transition from LOW level to HIGH level voltage may generate several pulses which must be suppressed by a filtering circuit or by a corresponding processing of the input signal within evaluation circuit or control unit 10. Moreover, reed contact 50 is subject to mechanical wear or fatigue, so that reed contact 50 and thus the flow meter may fail during a longer operation time. Such fail of the reed contact due to mechanical wear or fatigue is a common problem in home appliances which are designed for long operational life time.

There were some attempts to use electronic sensors or electronic switching elements, respectively, such as Hall effect sensor arrangements, in order to avoid the problems accompanying the reed contacts. These Hall sensor arrangements comprise electronic switches such as transistors which are not subject to mechanical wear or fatigue and do not exhibit contact bounce.

However, reed contact 50 having only two terminals (or leads), as shown in FIG. 5, cannot be easily replaced by a common Hall sensor chip, for example, since such Hall sensor chips require a dedicated power supply via a third terminal (or lead). Even Hall sensor chips with only two terminals and without a separate power supply terminal cannot be used to replace reed contact 50, since they cannot provide a short circuit or a very low resistance between their terminals, which is necessary for detecting a LOW level signal at common control units of home appliances. For a reliable operation of such two terminal Hall sensor chips, the voltage between their terminals must not fall below a relatively high voltage level, so that no LOW level signal can be generated at a simple digital input terminal such as shown in FIG. 5. Therefore, further adaptions and amendments to the control unit or evaluation unit 10 of the home appliance were necessary in order to use Hall sensor chips in flow meter arrangements.

U.S. Pat. No. 4,645,950 shows a two-lead Hall sensor providing a digital current signal. This Hall sensor is adapted to generate a first current strength appearing at its output terminal, indicating the sensing of a magnetic field, and a different second current strength, indicating a weak or absent magnetic field. A current measuring means is provided to evaluate the change of current strength.

However, there is still a need for a flow meter having a magneto-sensitive electronic unit which can replace a reed contact without increasing the complexity and costs of an evaluation circuit or control unit of a home appliance due to an additional electric current evaluation circuit, for example.

SUMMARY OF THE INVENTION

It is the object of the present invention to overcome the disadvantages of the prior art, and to provide a flow meter having a magneto-sensitive electronic unit (a magneto-sensitive electronic switching unit) which can replace a reed contact without requiring any amendments to the evaluation circuit or control unit in a home appliance such as a dishwasher or a washing machine.

This object is solved by a flow meter for a home appliance according to independent claim 1. The dependent claims are directed to advantageous further developments of the invention.

In a first aspect of the invention, a flow meter for a home appliance, in particular a dishwasher or a washing machine, comprises a control unit having a first power supply terminal, a second power supply terminal and a digital input terminal which is connected to the second power supply terminal via a limiting element, wherein the digital input terminal is configured to receive digital voltage signals; a movable element which is moved by a flow of a fluid and which comprises at least one movable magnetic element; and a two-lead magneto-sensitive unit which is arranged to detect a magnetic field or flux applied by the movable magnetic element, and which comprises a signal terminal configured to be connected to the digital input terminal of the control unit and a reference terminal configured to be connected to the first power supply terminal of the control unit; wherein the magneto-sensitive unit comprises a magnetic sensor element having two output terminals connected to the signal terminal and the reference terminal, respectively, of the magneto-sensitive unit and a power supply terminal; and a buffered power supply unit connected to the signal terminal and the reference terminal of the magneto-sensitive unit, and configured to generate a continuous auxiliary voltage from the signal terminal and the reference terminal of the magneto-sensitive unit and to provide the continuous auxiliary voltage at the power supply terminal of the magnetic sensor element.

According to a further embodiment of the invention, the buffered power supply unit comprises a buffering element connected between the reference terminal of the magneto-sensitive unit and the power supply terminal of the magnetic sensor element, and a rectifying element connected between the signal terminal of the magneto-sensitive unit and the power supply terminal of the magnetic sensor element. The rectifying element may preferably comprise a diode, preferably a Schottky diode. Alternatively, the rectifying element may comprise an active rectifier.

In an independent embodiment of the invention, the magnetic sensor element comprises a Hall effect sensor which comprises a Hall effect element and an electronic switching element, preferably a field effect transistor (FET). Alternatively, the magnetic sensor element comprises a magneto-resistive sensor which comprises a magneto-resistive element and an electronic switching element, preferably a field effect transistor (FET). In a further alternative embodiment, the magnetic sensor element comprises an inductive sensor which comprises an induction coil and an electronic switching element, preferably a field effect transistor (FET). Additional modules like an amplifier or a comparator, which are not show in detail here, may be integrated in the magnetic sensor element to interface magnetic sensor element and electronic switching element.

According to another further development of the embodiments of the invention, the movable magnetic element comprises a permanent magnet. Alternatively, the movable magnetic element comprises a magnetic flux conducting element.

According to another embodiment of the invention, the magneto-sensitive unit is configured to assume a first state providing a high resistance between the signal terminal and the reference terminal to generate a first digital signal level at the digital input terminal when the magnetic field or flux applied by the movable magnetic element corresponds to a first condition, and to assume a second state providing a low resistance or short circuit between the signal terminal and the reference terminal to generate a second digital signal level at the digital input terminal when the magnetic field or flux applied by the movable magnetic element corresponds to a second condition.

In a further development of the preceding embodiment, the magneto-sensitive unit is configured to assume and maintain a third state providing a medium resistance between the signal terminal and the reference terminal when the movable element is stopped so that the magnetic field or flux applied by the movable magnetic element continuously corresponds to the second condition, wherein the medium resistance is sufficiently low to prevent the generation the first digital signal level at the digital input terminal of the control unit. In this case, the magneto-sensitive unit may optionally further comprise an adapting unit connected to the magnetic sensor element and configured to adapt the magnetic sensor element so that the magneto-sensitive unit assumes and maintains the third state when the magnetic field or flux applied by the magnetic element continuously corresponds to the second condition.

According to another embodiment of the invention, the magneto-sensitive unit is configured to oscillate between a fourth and a fifth state with a predetermined frequency and/or a predetermined pulse duty factor when the movable element is stopped so that the magnetic field or flux applied by the magnetic element continuously corresponds to the second condition, wherein the fourth state provides a resistance between the signal terminal and the reference terminal generating the first digital signal level at the digital input terminal and the fifth state provides a resistance between the signal terminal and the reference terminal generating the second digital signal level at the digital input terminal, and wherein the predetermined frequency and/or the predetermined pulse duty factor is detected by the control unit to determine that the fluid flow has stopped. In this case, the magneto-sensitive unit may optionally further comprise an adapting unit connected to the magnetic sensor element and configured to adapt the magnetic sensor element so that the magneto-sensitive unit oscillates between the fourth and fifth states with the predetermined frequency and/or the predetermined pulse duty factor when the magnetic field or flux applied by the magnetic element continuously corresponds to the second condition.

In a second aspect of the invention, a two-lead magneto-sensitive unit for use with the above mentioned flow meter of the first aspect comprises a signal terminal and a reference terminal; a magnetic sensor element having two output terminals connected to the signal terminal and the reference terminal, respectively, of the magneto-sensitive unit and a power supply terminal; and a buffered power supply unit connected to the signal terminal and the reference terminal of the magneto-sensitive unit, and configured to generate a continuous auxiliary voltage from the signal terminal and the reference terminal of the magneto-sensitive unit and to provide the continuous auxiliary voltage at the power supply terminal of the magnetic sensor element.

Further advantages and preferred embodiments of the present invention will be described in the following together with the drawings listed below. The expressions "left", "right", "below" and "above" used in the following description are referred to the drawings in an alignment such that the reference numbers and the notation of the figures used can be read in normal orientation.

DETAILED DESCRIPTION

Figure 1:
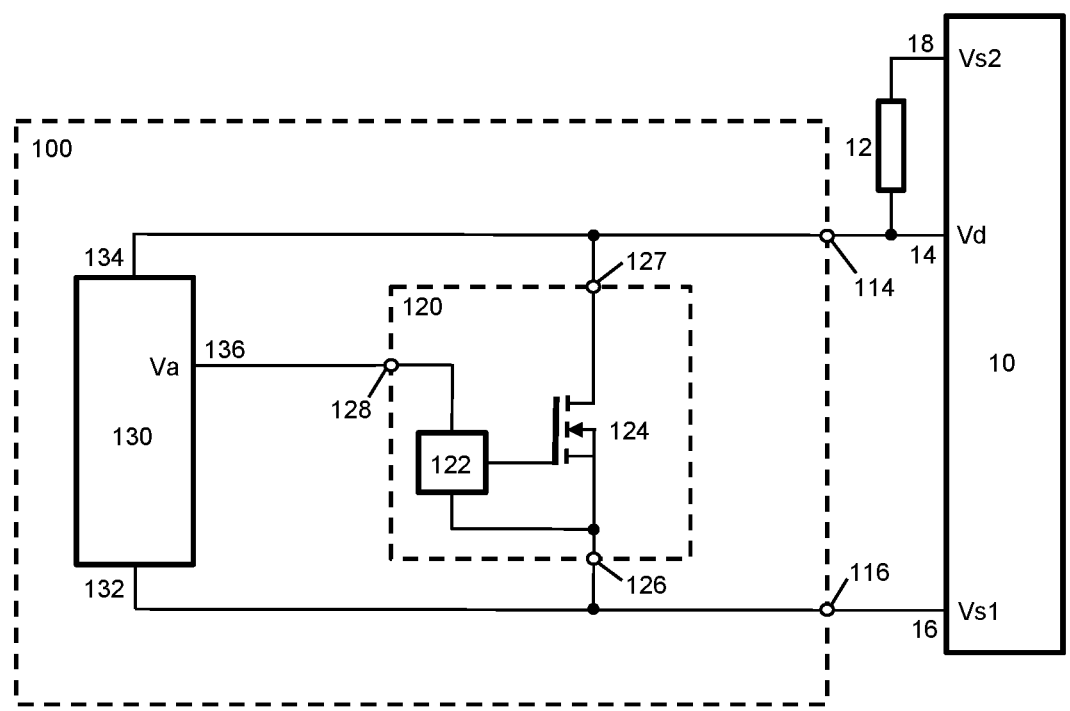
FIG. 1 is a circuit diagram of a flow meter according to the present invention.

With reference to FIG. 1, a flow meter according to a first embodiment of the present invention will be described. The general arrangement of a flow meter according to the invention is similar to that of a conventional flow meter as described above in connection with FIG. 5. In particular, an impeller or vane wheel (not shown) is rotated by a fluid flow to be measured and comprises at least one movable magnetic element (not shown) which is rotated together with the impeller, for example. The movable magnetic element may be a permanent magnet, for example. According to the present invention, a two-lead magneto-sensitive unit 100 is arranged adjacent to the impeller (preferably outside the fluid, e.g. positioned at the outside of an impeller casing) so that the movable magnetic element applies a magnetic field or flux to magneto-sensitive unit 100, wherein the applied magnetic field or flux is varied when the movable magnetic element rotates. The flow meter arrangement preferably comprises a sensor socket (not shown) for receiving magneto-sensitive unit 100. The sensor socket preferably comprises two contact pins which are connected to a first power supply terminal 16 which provides a first supply voltage or potential Vs1 and a digital input terminal 14 of a control unit (evaluation circuit) 10 of the home appliance. Digital input terminal 14 of control unit 10 is further connected via a limiting element 12 (preferably a pull-up resistor) to a second power supply terminal 18 which provides a second supply voltage or potential Vs2, which may be +3.3 V or +5.0 V or any other common digital supply voltage for digital logic circuits such as TTL or CMOS. The term "terminal" must not be construed in a limiting way, but encompasses a contact pin of a plug or socket, or an internal contact pin of an electric circuit or unit, as well as any point of a respective electric circuit (also across the boundaries of physical units or modules), such as a trace of a printed circuit board (PCB), carrying the corresponding potential or signal described. For example, limiting element 12 may be attached to contact pins of control unit 10, or may be integrated into control unit 10 and connected to corresponding points (e.g. PCB traces) of its electric circuitry.

For the sake of clarity, in following description of preferred embodiments of the invention, it is assumed that the first power supply voltage Vs1 is ground (i.e. 0.0 V) and the second power supply voltage Vs2 is a positive supply voltage, such as the above mentioned supply voltages of common digital logic circuits of +3.3 or +5.0 V. Thus, digital input terminal 14 is configured to receive digital voltage signals (Vd) provided by a sensor arrangement by either presenting a high resistance or open state (resulting in a digital HIGH level signal close to Vs2) or a low resistance or short circuit state (resulting in a digital LOW level signal close to Vs1) between terminals 14 and 16. However, it falls within the meaning of the present invention, if the first and second power supply voltages Vs1 and Vs2 are swapped, i.e. Vs1=+3.3 V and Vs2=0 V (ground). Alternatively, it is also conceivable that Vs2 is a negative power supply voltage. All these amendments correspond to a simple inversion of the digital logic levels HIGH and LOW, and a skilled person is able to adapt or invert the circuit diagrams and the construction of the flow meter of the present invention accordingly.

Figure 5:
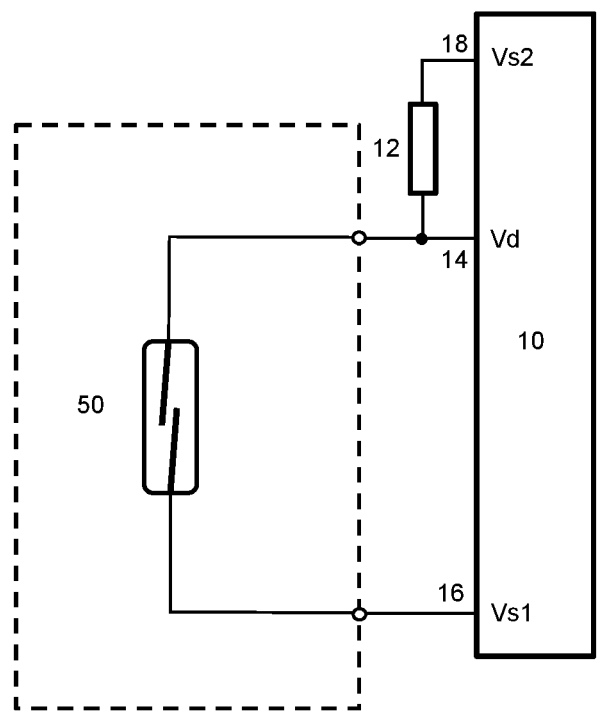
FIG. 5 is a circuit diagram of a flow meter according to prior art comprising a reed contact.

The sensor socket may also receive a common two-lead reed contact unit, such as reed contact 50 of FIG. 5, instead of the magneto-sensitive unit 100 of the invention. Thus, the two-lead magneto-sensitive unit 100 of the invention and a common reed contact unit are interchangeable with each other. Magneto-sensitive unit 100 preferably comprises a plug (not shown) which is configured to match with the sensor socket and which comprises a signal terminal 114 to be connected to the digital input terminal 14, as well as a reference terminal 116 to be connected to the first power supply terminal 16. The sensor socket is preferably protected against polarity reversal.

Magneto-sensitive unit 100 further comprises a magnetic sensor element 120 having three terminals, namely two output terminals 126, 127 as well as a power supply terminal 128, as shown in FIG. 1. Magnetic sensor element 120 may be a commercially available magneto-sensitive switching element, such as a Hall effect sensor or a magneto-resistive sensor or the like which may manufactured in the form of a unit or an integrated chip, and usually comprises, for example, a magneto-sensitive component 122 such as a Hall element or a different magneto-resistive element which is manipulated by an applied magnetic field or flux, and an electronic switching element 124 such as a transistor, preferably a FET (field effect transistor), which is connected between the output terminals 126, 127 and is controlled or switched in accordance with the strength of the magnetic field applied to magneto-sensitive component 122. Electronic switching element 124 is preferably configured to switch the connection between output terminals 126, 127, and thus between signal terminal 114 and reference terminal 116 and also between digital input terminal 14 and first power supply terminal 16, to a first state having a high resistance (electronic switching element 124 in its non-conducting or open state) or to a second state having a low resistance or short circuit (electronic switching element 124 in its conducting or closed state). In other words, magneto-sensitive unit 100 is configured to assume a first state providing a high resistance between signal terminal 114 and reference terminal 116 to generate a first digital signal level (HIGH) at digital input terminal 14 when the magnetic field or flux applied by the movable magnetic element corresponds to a first condition (weak or absent magnetic field or flux), and to assume a second state providing a low resistance or short circuit between signal terminal 114 and reference terminal 116 to generate a second digital signal level (LOW) at digital input terminal 14 when the magnetic field or flux applied by the movable magnetic element corresponds to a second condition (strong or present magnetic field or flux). The internal structure of magnetic sensor element 120 is not limited to the structure described above, and other designs are feasible. For example, magnetic sensor element 120 may further comprise a control circuitry such as an operational amplifier or a comparator for receiving a signal from magneto-sensitive component 122 and providing a suitable control signal to electronic switching element 124. Magnetic sensor element 120 may also be based on induction and may comprise an induction coil. In this case, instead of the strength of the magnetic field or flux, the rate of change of the magnetic flux at the magnetic sensor element 120 is detected, wherein an increasing magnetic field or flux as a first condition and a decreasing magnetic field or flux as a second condition are detected and converted into a signal that controls electronic switching element 124. Independent from the type of magnetic sensor element 120, the movable magnetic element may comprise a permanent magnet or a magnetic flux conducting element made of a magnetically soft material. If the movable magnetic element comprises a magnetically soft material, magneto-sensitive unit 100 preferably further comprises a permanent magnet and a magnetic circuit which is affected by the movement of the movable magnetic element such that the magnetic field or flux at magneto-sensitive component 122 is varied between the first and second conditions. In other words, the moving magnetic element varies the magnetically effective air gap, and thus the reluctance and the magnetic flux.

Magneto-sensitive unit 100 further comprises a buffered power supply unit 130 which has a first terminal 132 directly connected to reference terminal 116 and a second terminal 134 directly connected to signal terminal 114 of magneto-sensitive unit 100, as well as a third terminal 136 connected to power supply terminal 128 of magnetic sensor element 120. Buffered power supply unit 130 is configured to generate a continuous (buffered) auxiliary voltage Va from signal terminal 114 and reference terminal 116 of magneto-sensitive unit 100 and to provide that continuous auxiliary voltage Va at its third terminal 136 which is connected to terminal 128 of magnetic sensor element 120, in order to reliably supply magnetic sensor element 120 with a sufficient operating voltage level, even when the impeller is rotating and electronic switching element 124 of magnetic sensor element 120 intermittently short circuits its output terminals 126, 127 and the voltage at signal terminal 114 periodically collapses close to zero.

Figure 2:
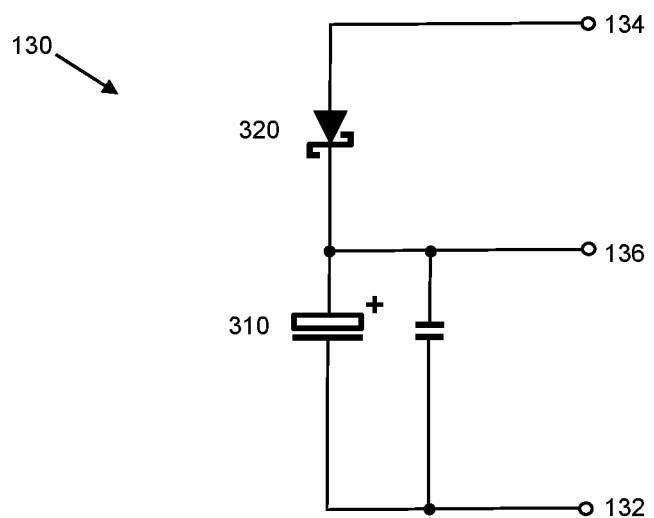
FIG. 2 is a partial circuit diagram showing the internal structure of a buffered power supply unit of a flow meter according to a first embodiment of the present invention.

In a first preferred embodiment of the invention, as shown in FIG. 2, buffered power supply unit 130 comprises a diode 320, preferably a Schottky diode, as a rectifying element which is connected between second terminal 134 and third terminal 136, and a capacitor 310 as a buffering element which is connected between first terminal 132 and third terminal 136. Alternatively, also a supercapacitor or an accumulator or rechargeable battery may be used as a buffering element. Rectifying element or diode 320 restricts the direction of the current flowing between second terminal 134 and third terminal 136 such that capacitor 310 can be charged when the voltage at signal terminal 114 is at HIGH level, i.e. transistor 124 is in its open state or high resistance state, but discharging of capacitor 310 is prevented when voltage at signal terminal 114 is at LOW level, i.e. transistor 124 is in its closed state or low resistance state. Capacitor 310 preferably comprises either a smaller ceramic capacitor having good high frequency characteristics and an electrolytic tantalum capacitor having a larger capacity, for example 6.8 µF to 10 µF or the like, or a MLCC (multi layer chip capacitor) which provides a compromise between high frequency response and large capacitance in a single component, to provide sufficient buffering capacity for the power supply of magnetic sensor element 120. Commercially available magneto-sensitive chips which can be used as magnetic sensor element 120 may require a supply voltage of about 3 V and a supply current of about 0.2 mA or less. In this way, the buffered power supply of magnetic sensor element 120 can be ensured by bridging usual LOW level signal periods appearing at signal terminal 114 without any significant drop of the auxiliary voltage level Va supplied to power supply terminal 128 of magnetic sensor element 120. In this manner, a reliable operation of magneto-sensitive unit 100, and thus, of the flow meter according to the invention can be ensured.

Figure 3:
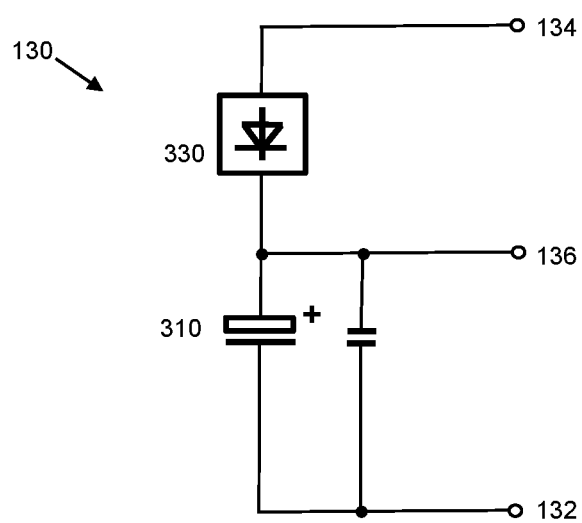
FIG. 3 is a partial circuit diagram showing the internal structure of a buffered power supply unit of a flow meter according to a second embodiment of the present invention.
Figure 4:
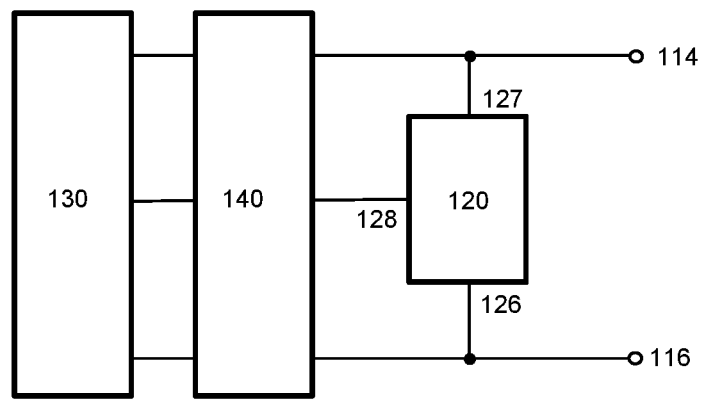
FIG. 4 is a partial circuit diagram of a flow meter according to a third embodiment of the present invention.

According to a second embodiment of the invention, as shown in FIG. 3, buffered power supply unit 130 comprises an active rectifier 330 as a rectifying element. This active rectifier 330, which is per se known in the art, may have, in comparison to the two terminal diode 320, a further terminal which is connected to first terminal 132, but not shown in FIG. 3. Active rectifier 330 is advantageous over diode 320 because the voltage drop at the diode (which is about 0.2 to 0.3 V in case of a Schottky diode) can be further reduced to a voltage drop at the active rectifier of less than 0.1 V, so that buffered power supply unit 130 according to the second embodiment can provide a higher auxiliary voltage level at voltage supply terminal 128 of magnetic sensor element 120. In this way, a greater variety of commercially available sensor chips can be used for magnetic sensor element 120.

If the fluid stops and the impeller or vane wheel of the flow meter is stopped in a position in which the movable magnetic element applies a strong magnetic field or flux to magneto-sensitive unit 100 (second condition), then transistor 124 is switched to its conducting (closed) state for a longer period of time. In this case, also the voltage level at signal terminal 114 remains at a very low level for a longer period of time, so that capacitor 310 is gradually discharged by the current drawn by magnetic sensor element 120, and auxiliary voltage Va gradually decreases. As soon as auxiliary voltage Va falls below the nominal operating voltage of magnetic sensor element 120, magnetic sensor element 120 may enter an undefined operating state which may provide an undefined resistance appearing between signal terminal 114 and reference terminal 116. This may either lead to a floating state providing a medium resistance between signal terminal 114 and reference terminal 116, or to an oscillation of the auxiliary voltage Va and the resistance appearing between signal terminal 114 and reference terminal 116, and thus to an oscillation of the voltage level at signal terminal 114. If such oscillations are crossing a LOW voltage threshold value and a HIGH voltage threshold value of control unit 10, control unit 10 detects a pulse sequence indicating a fluid flow, although the fluid flow has stopped. In order to prevent such malfunction of the flow meter according to the invention, the following provision may be made.

In a further embodiment of the invention, magnetic sensor element 120 is configured such that it slides into and maintains a more or less stable third state providing a medium resistance between signal terminal 114 and reference terminal 116 when the movable element is stopped so that the magnetic flux applied by the magnetic element is continuously strong or present (second condition). In this case this medium resistance must be sufficiently low to keep the voltage at signal terminal 114 below a HIGH level threshold (first digital signal level) of digital input terminal 14 of control unit 10, so that no HIGH level pulses are generated and detected at the digital input terminal 14. Simultaneously, the voltage level at signal terminal 114 of magneto-sensitive unit 100 is high enough to maintain this third state by holding transistor 124 in a floating state between its open state and its closed state. In this manner, no impulses will be detected at digital input terminal 14 of control unit 10 when the fluid flow and the impeller are stopped in a position in which a strong magnetic field or flux is applied to magneto-sensitive unit 100.

In another embodiment, magneto-sensitive unit 100 further comprises an adapting unit 140 which is connected to magnetic sensor element 120. Adapting unit 140 may comprise further resistor, inductor or capacitor elements, or may also comprise active electronic elements such as transistors, in order to adapt magnetic sensor element 120 such that magnetic sensor element 120 or magneto-sensitive unit 100, respectively, slides into and maintains said third state. In this manner, also commercially available sensor chips may be used as magnetic sensor element 120 which would per se not exhibit the desired behavior.

In a further embodiment, magnetic sensor element 120 is configured such that, when the movable element is stopped so that the magnetic flux applied by the magnetic element is continuously strong or present (second condition), it enters into a stable oscillation state in which it oscillates between a fourth state providing a relatively low resistance between signal terminal 114 and reference terminal 116, so that a LOW level signal (second digital signal level) is generated at signal terminal 114, and a fifth state providing a relatively high resistance between signal terminal 114 and reference terminal 116, so that a HIGH level signal (first digital signal level) is generated at signal terminal 114. This stable oscillation preferably exhibits a predetermined characteristic frequency, which may be a resonant frequency of the flow meter sensor arrangement. Alternatively or additionally, this stable oscillation exhibits a predetermined characteristic pulse duty factor, i.e. a characteristic ratio between the durations of the fourth and fifth states. The control unit or evaluation circuit 10 is in this case configured to detect this predetermined characteristic frequency and/or this predetermined characteristic pulse duty factor, which preferably do not appear during normal operation of the flow meter, and thus determines that the fluid flow and the impeller of the flow meter have stopped.

In another embodiment, magneto-sensitive unit 100 further comprises an adapting unit 140 which is connected to magnetic sensor element 120. Adapting unit 140 may comprise further resistor, inductor or capacitor elements, or may also comprise active electronic elements such as transistors, in order to adapt magnetic sensor element 120 such that magnetic sensor element 120 or magneto-sensitive unit 100, respectively, enters a stable oscillation between the fourth state and the fifth state with the predetermined frequency and/or the predetermined pulse duty factor, as described above, when the magnetic flux applied by the magnetic element is continuously strong or present. In this manner, also commercially available sensor chips may be used as magnetic sensor element 120 which would per se not exhibit the desired behavior.

Adapting unit 140 may, for example, comprise a capacitor connected between output terminal 127 and power supply terminal 128 of magnetic sensor element 120 and/or a resistor connected between output terminal 126 and power supply terminal 128 in order to suppress any oscillations, or alternatively, to impose a predetermined characteristic resonant frequency or a predetermined characteristic pulse duty factor.

All components of magneto-sensitive unit 100 are preferably mounted on a single circuit board together with the plug which matches with the sensor socket of the flow meter. Thus, magneto-sensitive unit 100 can be easily replaced by another magneto-sensitive unit 100 or by a common reed contact unit having a similar plug and similar dimensions. This provides additional freedom during the production of home appliances, so that a manufacturer can arbitrarily choose between a cheaper reed contact unit 50 and a more reliable magneto-sensitive unit 100 according to the present invention, depending on the requirements to be met.

In alternative embodiments of the invention, limiting element 12 and control unit 10 may be arranged within a flow meter module, or may be mounted on another component of the home appliance. For example, the function of control unit 10 may be integrated in a control device of the home appliance. Limiting element 12 of FIG. 1, which connects digital input terminal 14 of control device 10 to a first power supply voltage Vs1 may be a resistor as described above, or may be a constant-current source or any other limiting circuit which, similar to an ohmic resistance, generates at digital input terminal 14 a HIGH level voltage signal when electronic switching element 124 is in its non-conducting (open) state, and a LOW level voltage signal close to zero (ground) when electronic switching element 124 is in its conducting (closed) state. For example, a so called weak transistor may be used as limiting element 12, such as a FET configured to maintain a conducting state with increased resistance (medium conducting state).

In the above description of the preferred embodiments of the invention, it is assumed that the first state of magneto-sensitive unit 100 provides a high resistance between its terminals 114, 116, the second state of the same provides a low resistance or short circuit between its terminals 114, 116, and that the first condition of the magnetic field or flux corresponds to a weak or absent magnetic field or flux, and the second condition of the magnetic field or flux corresponds to a strong or present magnetic field or flux. Moreover, it is assumed that the first digital signal level is HIGH and the second digital signal level is LOW. It is however conceivable that the first state of magneto-sensitive unit 100 provides a low resistance or short circuit between its terminals 114, 116 and the second state of the same provides a high resistance between its terminals 114, 116. Alternatively or additionally, it is also possible that the first condition of the magnetic field or flux corresponds to a strong or present magnetic field or flux, and the second condition of the magnetic field or flux corresponds to a weak or absent magnetic field or flux. Alternatively or additionally, it is also possible that that the first digital signal level is LOW and the second digital signal level is HIGH. Such amendments are simple inversions of the disclosed principles and fall within the meaning of the present invention. A skilled person is able to adapt the disclosed circuit diagrams and the construction accordingly, e.g. by swapping the polarity of certain terminals or components (such as diode 320 or capacitor 310) or by replacing some components with similar components of a complementary type (e.g. replacing n-type FET 24 shown in FIG. 1 with a p-type FET).

LIST OF REFERENCE SIGNS

10 control unit
12 limiting element
14 digital input terminal
16, 18 first and second power supply terminals
50 reed contact
100 magneto-sensitive unit
114 signal terminal of magneto-sensitive unit 116 reference terminal of magneto-sensitive unit
120 magnetic sensor element
122 magneto-sensitive component
124 electronic switching element
126, 127 first and second output terminals of magnetic sensor element
128 power supply terminal of magnetic sensor element
130 buffered power supply unit
132, 134, 136 first, second and third terminals of buffered power supply unit
140 adapting unit
310 buffering element, capacitor
320 diode
330 active rectifier

The invention claimed is:

1. A magneto-sensitive unit for use with a flow meter having a movable element which is moved by a flow of a fluid and which comprises at least one movable magnetic element, the unit comprising:
   two terminals, namely a signal terminal and a reference terminal;
   a magnetic sensor element having two output terminals connected to the signal terminal and the reference terminal, respectively, of the magneto-sensitive unit and a power supply terminal; and
   a buffered power supply unit connected to the signal terminal and the reference terminal of the magneto-sensitive unit, and configured to generate a continuous auxiliary voltage from the signal terminal and the reference terminal of the magneto-sensitive unit and to provide the continuous auxiliary voltage at the power supply terminal of the magnetic sensor element;
   wherein the magneto-sensitive unit is configured to assume a first state providing a high resistance between the signal terminal and the reference terminal to generate a first digital signal level at the signal terminal when a magnetic field or flux applied by the movable magnetic element corresponds to a first condition, and to assume a second state providing a low resistance or short circuit between the signal terminal and the reference terminal to generate a second digital signal level at the signal terminal when the magnetic field or flux applied by the movable magnetic element corresponds to a second condition; and
   wherein the magneto-sensitive unit is configured to assume and maintain a third state providing a medium resistance between the signal terminal and the reference terminal when the movable element is stopped so that the magnetic field or flux applied by the movable magnetic element continuously corresponds to the second condition, wherein the medium resistance is sufficiently low to prevent the generation the first digital signal level at the signal terminal.

2. A flow meter for a dishwasher or a washing machine, the flow meter comprising:
   a control unit having a first power supply terminal, a second power supply terminal and a digital input terminal which is connected to the second power supply terminal via a limiting element, wherein the digital input terminal is configured to receive digital voltage signals;
   a movable element which is moved by a flow of a fluid and which comprises at least one movable magnetic element; and
   a magneto-sensitive unit according to claim 1 which is arranged to detect a magnetic field or flux applied by the movable magnetic element, wherein the signal terminal of the magneto-sensitive unit is connected to the digital input terminal of the control unit and the reference terminal of the magneto-sensitive unit is connected to the first power supply terminal of the control unit.

3. The unit according to claim 1,
wherein the buffered power supply unit comprises a buffering element connected between the reference terminal of the magneto-sensitive unit and the power supply terminal of the magnetic sensor element, and a rectifying element connected between the signal terminal of the magneto-sensitive unit and the power supply terminal of the magnetic sensor element.

4. The unit according to claim 3,
wherein the rectifying element comprises a diode.

5. The unit according to claim 3,
wherein the rectifying element comprises an active rectifier.

6. The unit according to claim 1,
wherein the magnetic sensor element comprises a Hall effect sensor which comprises a Hall effect element and an electronic switching element.

7. The unit according to claim 1,
wherein the magnetic sensor element comprises a magneto-resistive sensor which comprises a magneto-resistive element and an electronic switching element.

8. The unit according to claim 1,
wherein the magnetic sensor element comprises an inductive sensor which comprises an induction coil and an electronic switching element.

9. The unit according to claim 1,
wherein the movable magnetic element comprises a permanent magnet.

10. The unit according to claim 1,
wherein the movable magnetic element comprises a magnetic flux conducting element.

11. The unit according to claim 1,
wherein the magneto-sensitive unit further comprises an adapting unit connected to the magnetic sensor element and configured to adapt the magnetic sensor element so that the magneto-sensitive unit assumes and maintains the third state when the magnetic field or flux applied by the movable magnetic element continuously corresponds to the second condition.

12. A magneto-sensitive unit for use with a flow meter having a movable element which is moved by a flow of a fluid and which comprises at least one movable magnetic element, the unit comprising:
   two terminals, namely a signal terminal and a reference terminal;
   a magnetic sensor element having two output terminals connected to the signal terminal and the reference terminal, respectively, of the magneto-sensitive unit and a power supply terminal; and
   a buffered power supply unit connected to the signal terminal and the reference terminal of the magneto-sensitive unit, and configured to generate a continuous auxiliary voltage from the signal terminal and the reference terminal of the magneto-sensitive unit and to provide the continuous auxiliary voltage at the power supply terminal of the magnetic sensor element;
   wherein the magneto-sensitive unit is configured to assume a first state providing a high resistance between the signal terminal and the reference terminal to generate a first digital signal level at the signal terminal when a magnetic field or flux applied by the movable magnetic element corresponds to a first condition, and to assume a second state providing a low resistance or short circuit between the signal terminal and the reference terminal to generate a second digital signal level at the signal terminal when the magnetic field or flux applied by the movable magnetic element corresponds to a second condition; and wherein the magneto-sensitive unit is configured to oscillate between a fourth and a fifth state with a predetermined frequency and/or a predetermined pulse duty factor when the movable element is stopped so that the magnetic field or flux applied by the movable magnetic element continuously corresponds to the second condition, wherein the fourth state provides a resistance between the signal terminal and the reference terminal generating the first digital signal level at the signal terminal and the fifth state provides a resistance between the signal terminal and the reference terminal generating the second digital signal level at the signal terminal.

13. The unit according to claim 12,
wherein the magneto-sensitive unit further comprises an adapting unit connected to the magnetic sensor element and configured to adapt the magnetic sensor element so that the magneto-sensitive unit oscillates between the fourth and fifth states with the predetermined frequency and/or the predetermined pulse duty factor when the magnetic field or flux applied by the movable magnetic element continuously corresponds to the second condition.

14. The unit according to claim 12,
wherein the buffered power supply unit comprises a buffering element connected between the reference terminal of the magneto-sensitive unit and the power supply terminal of the magnetic sensor element, and a rectifying element connected between the signal terminal of the magneto-sensitive unit and the power supply terminal of the magnetic sensor element.

15. The unit according to claim 14,
wherein the rectifying element comprises a diode.

16. The unit according to claim 14,
wherein the rectifying element comprises an active rectifier.

17. The unit according to claim 12,
wherein the magnetic sensor element comprises a Hall effect sensor which comprises a Hall effect element and an electronic switching element.

18. The unit according to claim 12,
wherein the magnetic sensor element comprises a magneto-resistive sensor which comprises a magneto-resistive element and an electronic switching element.

19. The unit according to claim 12,
wherein the magnetic sensor element comprises an inductive sensor which comprises an induction coil and an electronic switching element.

20. The unit according to claim 12,
wherein the movable magnetic element comprises a permanent magnet.

21. The unit according to claim 12,
wherein the movable magnetic element comprises a magnetic flux conducting element.

22. A flow meter for a dishwasher or a washing machine, the flow meter comprising:
a control unit having a first power supply terminal, a second power supply terminal and a digital input terminal which is connected to the second power supply terminal via a limiting element, wherein the digital input terminal is configured to receive digital voltage signals;
a movable element which is moved by a flow of a fluid and which comprises at least one movable magnetic element; and
a magneto-sensitive unit according to claim 12 which is arranged to detect a magnetic field or flux applied by the movable magnetic element, wherein the signal terminal of the magneto-sensitive unit is connected to the digital input terminal of the control unit and the reference terminal of the magneto-sensitive unit is connected to the first power supply terminal of the control unit.

* * * * *